(12) United States Patent
Baek

(10) Patent No.: US 10,867,946 B2
(45) Date of Patent: Dec. 15, 2020

(54) SEMICONDUCTOR CHIP, PRINTED CIRCUIT BOARD, MULTI-CHIP PACKAGE INCLUDING THE SEMICONDUCTOR CHIP AND PRINTED CIRCUIT BOARD, AND METHOD OF MANUFACTURING THE MULTI-CHIP PACKAGE

(71) Applicant: SK hynix Inc., Icheon-si, Gyeonggi-do (KR)

(72) Inventor: Jin Ho Baek, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 10 days.

(21) Appl. No.: 16/168,653

(22) Filed: Oct. 23, 2018

(65) Prior Publication Data

US 2019/0295975 A1    Sep. 26, 2019

(30) Foreign Application Priority Data

Mar. 22, 2018    (KR) ........................ 10-2018-0032986

(51) Int. Cl.
| | | |
|---|---|---|
| *H01L 23/34* | (2006.01) | |
| *H01L 23/367* | (2006.01) | |
| *H01L 23/528* | (2006.01) | |
| *H01L 25/065* | (2006.01) | |
| *H01L 25/10* | (2006.01) | |
| *H05K 1/18* | (2006.01) | |
| *H01L 23/00* | (2006.01) | |
| *H01L 21/82* | (2006.01) | |

(52) U.S. Cl.
CPC .............. *H01L 24/09* (2013.01); *H01L 21/82* (2013.01); *H01L 23/367* (2013.01); *H01L 24/17* (2013.01); *H05K 1/184* (2013.01); *H01L 2224/02371* (2013.01)

(58) Field of Classification Search
CPC ........ H01L 25/065; H01L 23/31; H05K 1/181
See application file for complete search history.

(56) References Cited

U.S. PATENT DOCUMENTS

| | | | | | |
|---|---|---|---|---|---|
| 5,604,377 | A | * | 2/1997 | Palagonia ........... | H01L 25/0657 257/685 |
| 6,104,615 | A | * | 8/2000 | Pohl ...................... | H01L 25/105 257/713 |
| 2001/0014489 | A1 | * | 8/2001 | Kinsman ............. | H01L 25/0657 438/107 |
| 2003/0082856 | A1 | * | 5/2003 | Farnworth .......... | H01L 23/3171 438/127 |

(Continued)

FOREIGN PATENT DOCUMENTS

| | | |
|---|---|---|
| KR | 100256307 B1 | 5/2000 |
| KR | 100913722 B1 | 8/2009 |

*Primary Examiner* — Omar F Mojaddedi
(74) *Attorney, Agent, or Firm* — William Park & Associates Ltd.

(57) ABSTRACT

A multi-chip package may include a plurality of semiconductor chips and a printed circuit board (PCB). Each of the semiconductor chips may have an upper surface, a bottom surface, and a plurality of side surfaces. Circuit terminals may be arranged on the upper surface. A plurality of side bonding pads may be arranged on one or more selected side surface among the side surfaces. The semiconductor chips may be mounted on the PCB. The PCB may be configured to surround the selected side surface on which the side bonding pads may be arranged.

11 Claims, 8 Drawing Sheets

(56) References Cited

U.S. PATENT DOCUMENTS

2007/0007645 A1* 1/2007 Yoon ..................... H01L 25/105
257/723
2009/0236721 A1* 9/2009 Meguro ................ H01L 25/105
257/686

* cited by examiner

SEMICONDUCTOR CHIP, PRINTED CIRCUIT BOARD, MULTI-CHIP PACKAGE INCLUDING THE SEMICONDUCTOR CHIP AND PRINTED CIRCUIT BOARD, AND METHOD OF MANUFACTURING THE MULTI-CHIP PACKAGE

CROSS-REFERENCES TO RELATED APPLICATION

The present application claims priority under 35 U.S.C. § 119(a) to Korean application number 10-2018-0032986, filed on Mar. 22, 2018, in the Korean Intellectual Property Office, which is incorporated herein by reference in its entirety.

BACKGROUND

1. Technical Field

Various embodiments may generally relate to a semiconductor integrated circuit device, and more particularly, to a semiconductor chip, a printed circuit board, a multi-chip package including the semiconductor chip and printed circuit board, and a method of manufacturing the multi-chip package.

2. Related Art

In a semiconductor industry, a semiconductor device having various functions, high capacity and high reliability may be manufactured at a low cost. One important technique for achieving the above-mentioned goals is to use a particular semiconductor packaging technique. The semiconductor packaging technique, to achieve the above recited goals, may include a stacked semiconductor package including stacked semiconductor chips. The stacked semiconductor chips may be electrically connected with a printed circuit board (PCB) through a wire, or a though silicon via (TSV), etc.

SUMMARY

In an example of an embodiment of the present disclosure, a multi-chip package may be provided. The multi-chip package may include a plurality of semiconductor chips and a printed circuit board (PCB). Each of the semiconductor chips may have an upper surface, a bottom surface, and a plurality of side surfaces. Circuit terminals may be arranged on the upper surface. A plurality of side bonding pads may be arranged on one or more selected side surface among the side surfaces. The semiconductor chips may be mounted on the PCB. The PCB may be configured to surround the selected side surface on which the side bonding pads may be arranged.

In an example of an embodiment of the present disclosure, a semiconductor chip may be provided. The semiconductor chip may include an upper surface, a bottom surface, a plurality of side surfaces and side bonding pads. The upper surface may have a core region and a plurality of edge regions. Circuit terminals may be arranged in the core region. The edge regions may be configured to surround the core region. The bottom surface may have a size substantially the same as that of the upper surface. The bottom surface may face the upper surface. The side surfaces may be extended from the edge regions to the bottom surface. The side bonding pads may be arranged on a selected side surface of the side surfaces to receive external signals.

In an example of an embodiment of the present disclosure, a printed circuit board (PCB) may be provided. The PCB may include a circuit substrate and a plurality of electrode terminals. The circuit substrate may have a plurality of slits formed on a surface of the PCB. The slits may be extended on the surface of the PCB. The electrode terminals may be arranged on a bottom surface of each of the slits to receive an electrical signal.

In an example of an embodiment of the present disclosure, a method of manufacturing a multi-chip package may be provided. In the method of manufacturing the multi-chip package, a wafer including a plurality of semiconductor chips may be prepared. A plurality of bonding pads may be arranged in each of edge regions of scribe lanes between the semiconductor chips. The wafer may be cut along scribe lanes between the semiconductor chips to singulate the semiconductor chips. Side bonding pads corresponding to the bonding pads may be formed on a selected side surface of side surfaces of each of the semiconductor chips. A redistribution layer may be connected between the bonding pads and the side bonding pads. Each of the semiconductor chips may be mounted on a PCB to electrically connect the side bonding pads with electrode terminals of the PCB.

DETAILED DESCRIPTION

Various embodiments will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concepts. Although a few embodiments of the present disclosure will be illustrated and described, it will be appreciated by those of ordinary skill in the art that changes may be made in these embodiments without departing from the principles and spirit of the present disclosure.

Examples of embodiments may provide a semiconductor chip and a printed circuit board that may be capable of improving signal transmission characteristics and heat dissipation characteristics.

Examples of embodiments may also provide a multi-chip package including the above-mentioned semiconductor chip and the printed circuit board.

Examples of embodiments may still also provide a method of manufacturing the above-mentioned multi-chip package.

Figure 1:
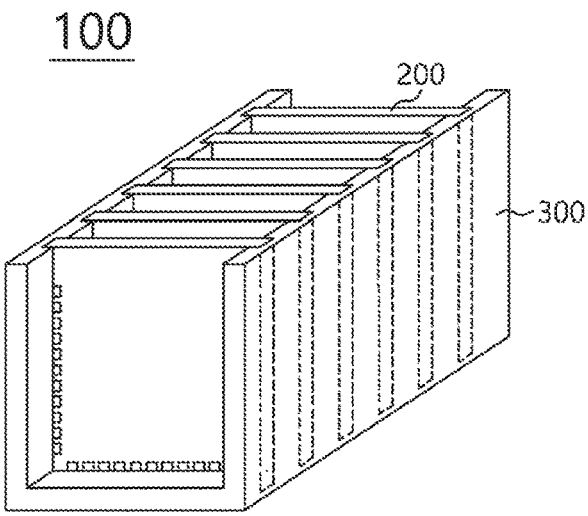
FIG. 1 is a perspective view illustrating a multi-chip package in accordance with an embodiment.

FIG. 1 is a perspective view illustrating a multi-chip package in accordance with an embodiment.

Referring to FIG. 1, a multi-chip package 100 of an embodiment may include a plurality of semiconductor chips 200 and a printed circuit board (PCB) 300. The semiconductor chips 200 may be mounted on the PCB 300. At least one side surface of each of the semiconductor chips 200 may be electrically connected with the PCB 300.

Figure 2:
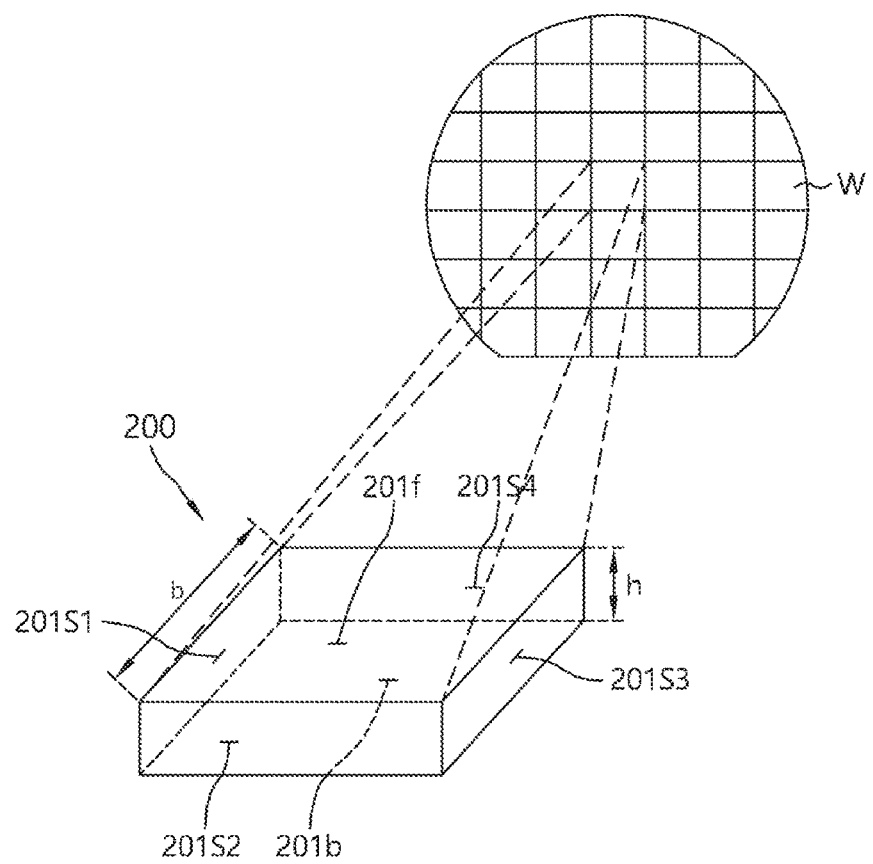
FIG. 2 is a perspective view illustrating a semiconductor chip in accordance with an embodiment.

FIG. 2 is a perspective view illustrating a semiconductor chip in accordance with an embodiment.

Referring to FIG. 2, the semiconductor chips 200 may be formed in a wafer W. Thus, the semiconductor chips 200 may be separated from the wafer W. The semiconductor chip 200 may be named by a die.

The semiconductor chip 200 may have a hexahedral shape such as a rectangular parallelepiped shape or a cubic shape. The semiconductor chip 200 may have a quadrangular upper surface 201f and a bottom surface 201b having a size corresponding to a size of the upper surface 201f. The semiconductor chip 200 may have four side surfaces 201S1~201S4 extended from an edge portion of the upper surface 201f to an edge portion of the bottom surface 201b. A character "h" refers to a height of the semiconductor chip 200.

Figure 3:
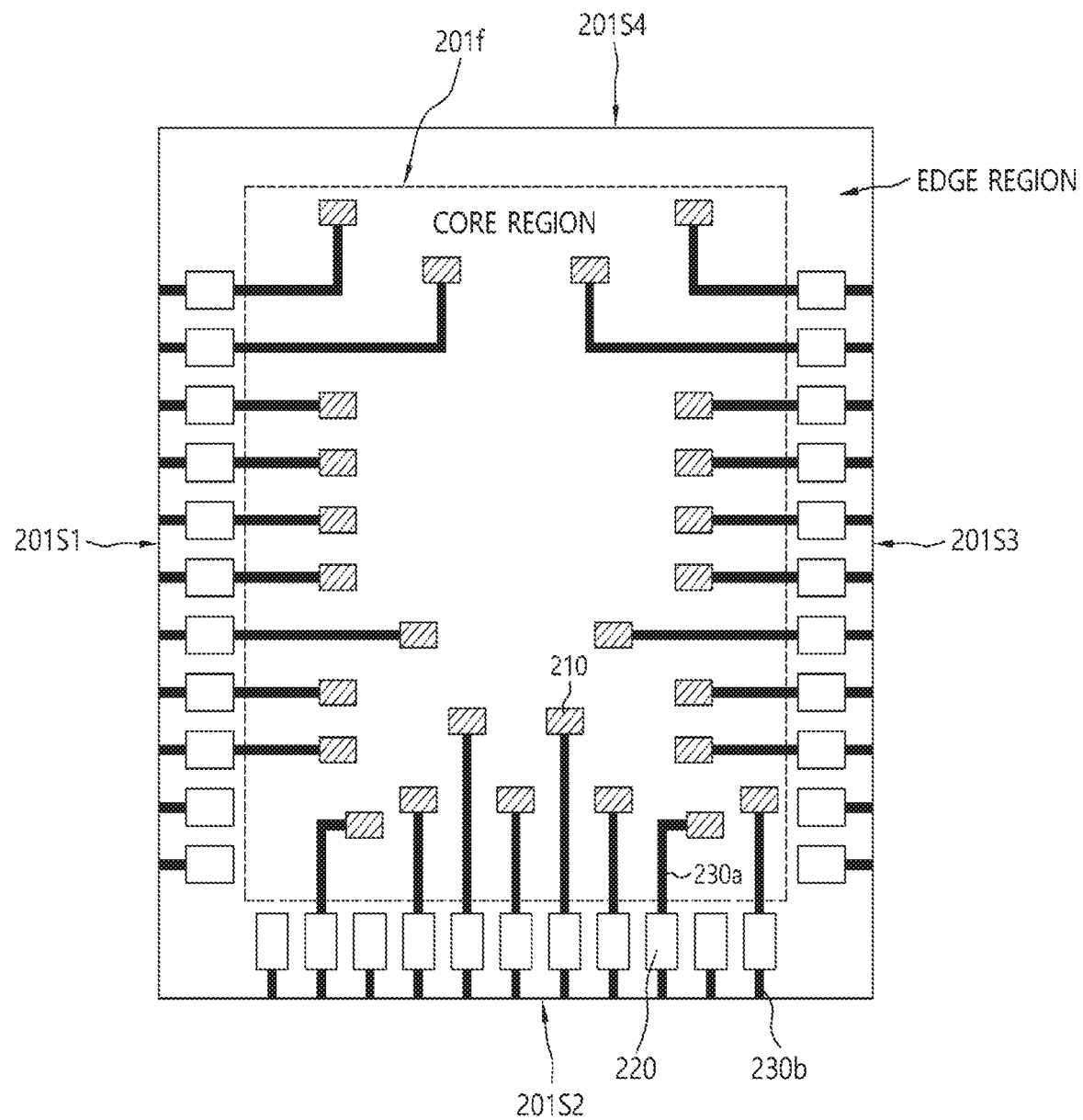
FIG. 3 is a plan view illustrating an upper surface of a semiconductor chip in accordance with an embodiment.

FIG. 3 is a plan view illustrating an upper surface of a semiconductor chip in accordance with an embodiment.

Referring to FIG. 3, the upper surface 201f of the semiconductor chip 200 may have four edge regions. The semiconductor chip 200 may be classified into a core region and a peripheral region. Elements of the semiconductor chip 200 may be formed in the core region. The peripheral region may be configured to surround the core region.

The semiconductor chip 200 may include a circuit terminal 210, a bonding pad 220, an inner redistribution layer 230a and an outer redistribution layer 230b.

The circuit terminal 210 may be electrically connected with electrodes of each element (not illustrated). The circuit terminal 210 may be arranged on an uppermost surface of the wafer W.

The bonding pad 220 may be arranged in a selected region of the edge regions. The selected region may include two edge regions arranged in a row. For example, when the semiconductor chip 200 has the quadrangular shape, the edge regions may be four. The bonding pad 220 may be arranged in three edge regions among the four edge regions. Alternatively, the bonding pad 220 may be arranged at one edge region or two edge regions. The bonding pad 220 may include a plurality of bonding pads spaced apart from each other on the selected edge region.

The inner redistribution layer 230a may be selectively connected between the circuit terminal 210 in the core region and the bonding pads 220.

The outer redistribution layer 230b may be connected with the bonding pads 220. The outer redistribution layer 230b may be protruded from a corner of the semiconductor chip 200.

Figure 4:
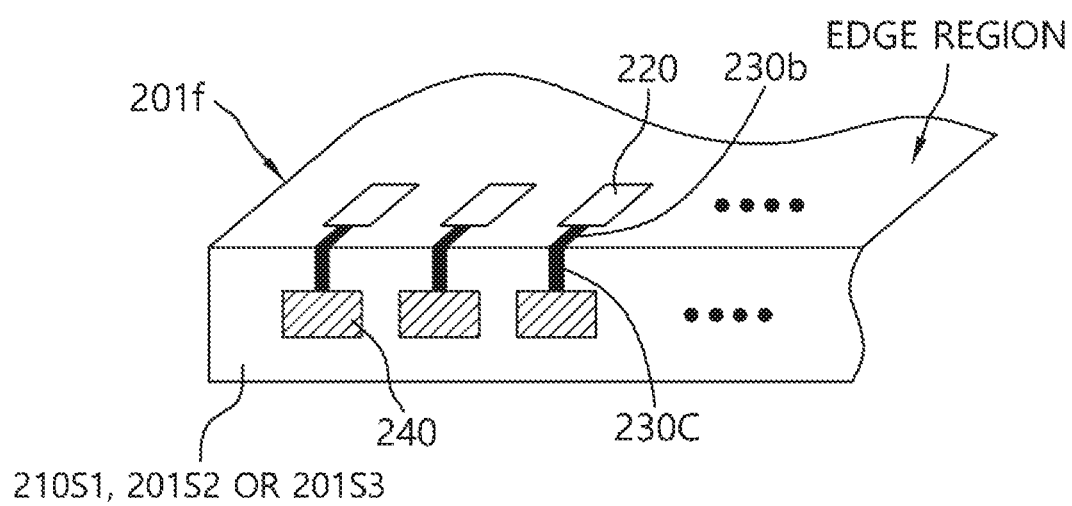
FIG. 4 is a perspective view illustrating a selected side surface of a semiconductor chip in accordance with an embodiment.
Figure 5:
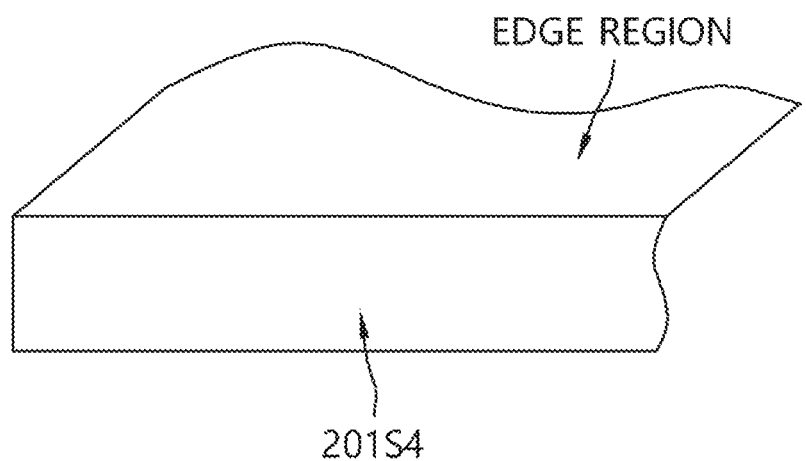
FIG. 5 is a perspective view illustrating a non-selected side surface of a semiconductor chip in accordance with an embodiment.

FIG. 4 is a perspective view illustrating a selected side surface of a semiconductor chip in accordance with an embodiment and FIG. 5 is a perspective view illustrating a non-selected side surface of a semiconductor chip in accordance with an embodiment.

Referring to FIG. 4, selected side surfaces 201S1, 201S2 and 201S3 may include a plurality of side bonding pads 240 and a side redistribution layer 230c. The selected side surfaces 201S1, 201S1 and 201S3 may include successively arranged at least two side surfaces or at least two side surfaces substantially perpendicular to each other. For example, the side bonding pad 240 may be formed to correspond to the bonding pad 230 on the upper surface 201f of the semiconductor chip 200. The side redistribution layer 230c may be connected between the outer redistribution layer 230b and the side bonding pad 240. The outer redistribution layer 230b and the side redistribution layer 230c may include a single line. That is, the outer redistribution layer 230b and the side redistribution layer 230c may be formed by a same process. Thus, the side redistribution layer 230c may be a part of the outer redistribution layer 230b.

Referring to FIG. 5, the bonding pad 220 and the side bonding pad 240 might not be arranged on a non-selected edge region and the side surface 201S4 extended from the non-selected edge region.

Figure 6:
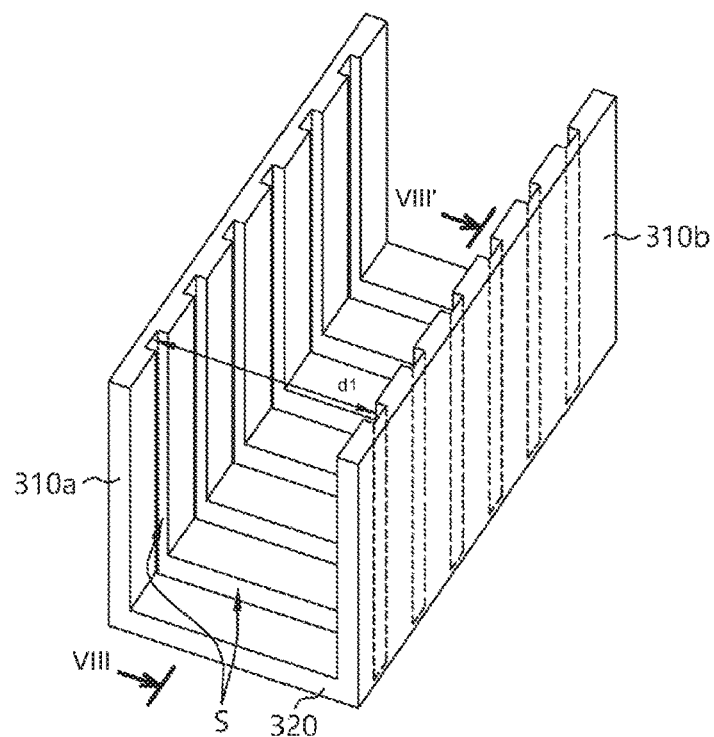
FIG. 6 is a perspective view illustrating a PCB in accordance with an embodiment.
Figure 7:
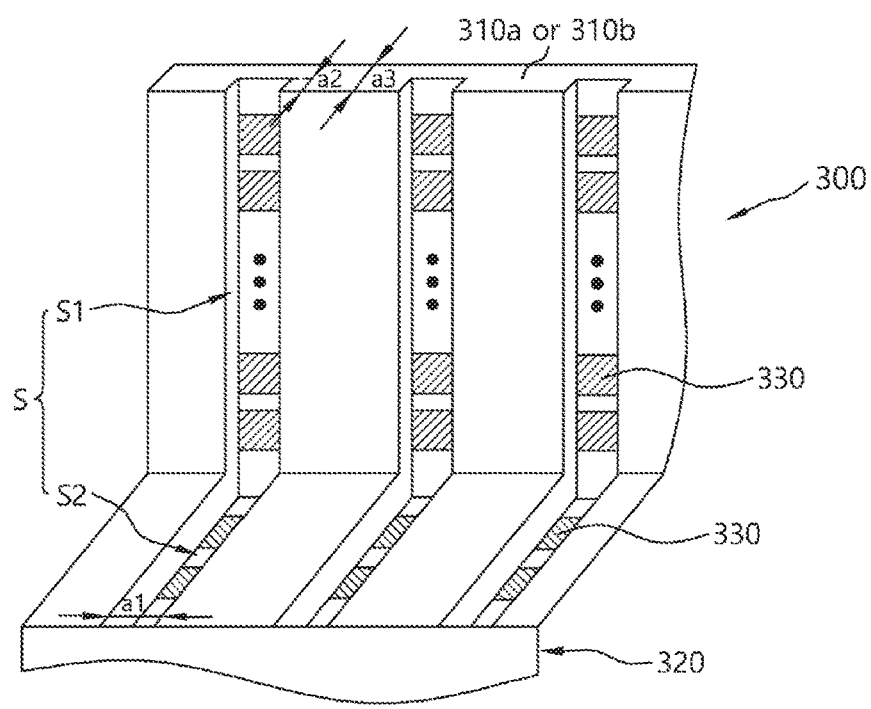
FIG. 7 is a perspective view illustrating a side surface or a bottom surface of a PCB in accordance with an embodiment.
Figure 8:
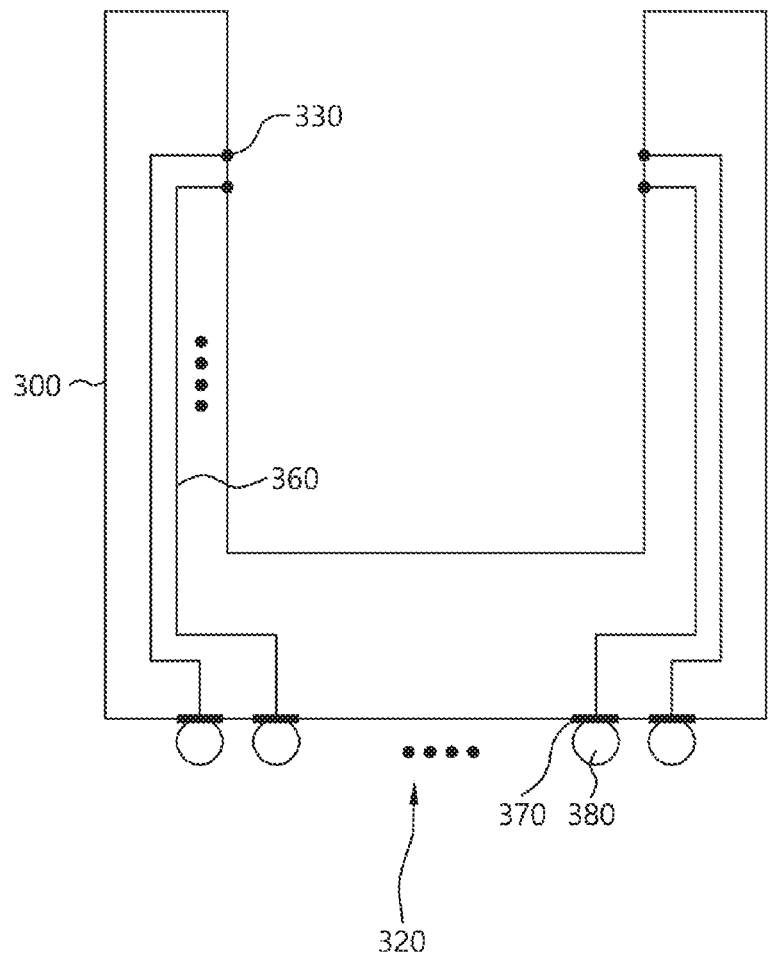
FIG. 8 is a cross-sectional view illustrating a PCB in accordance with an embodiment.

FIG. 6 is a perspective view illustrating a PCB in accordance with an embodiment, FIG. 7 is a perspective view illustrating a side surface or a bottom surface of a PCB in accordance with an embodiment, and FIG. 8 is a cross-sectional view illustrating a PCB in accordance with an embodiment.

Referring to FIG. 6, the PCB 300 may be configured to surround the side surfaces 201S1~201S3 of the semiconductor chip 200 on which the side bonding pad 240 may be arranged.

For example, when the side bonding pad 240 is arranged on the three side surfaces 201S1~201S3, the PCB 300 may include a first side surface 310a, a second side surface 310b spaced apart from the first side surface 310a, and a bottom surface 320 connected between the first and second side surfaces 310a and 310b. The PCB 300 may have a shape configured to surround the side surfaces 201S1~201S3 on which the side bonding pad 240 may be arranged. For example, the PCB 300 may have a "U" shape.

A plurality of slits S may be formed at the first side surface 310a, the second side surface 310b and the bottom surface 320. Each of the slits S may be configured to receive the side surfaces 201S1~201S3.

Referring to FIG. 7, the slits S may be arranged spaced apart from each other on the first side surface 310a, the second side surface 310b and the bottom surface 320. Each of the slits S may have a width a1. The width a1 of the slit S may be substantially equal to or greater than the height h of the semiconductor chip 200 (See FIG. 2). The slit S may have a depth a2 less than a thickness a3 of the first and second side surfaces 310a and 310b and the bottom surface 320 of the PCB 300. A first slit S1 on the first and second side surfaces 310a and 310b may be in fluidic communication with a second slit S2 on the bottom surface 320. Thus, the slit S might not have a disconnection section.

A plurality of electrode pads 330 may be formed in each of the slits S. When the semiconductor chip 200 is inserted into the slit S, the electrode pads 330 may be positioned corresponding to the side bonding pads 240.

A distance d1 between the slit S1 on the first side surface 310a and the slit S1 on the second side surface 310b may be substantially equal to or slightly greater than a side length b of the semiconductor chip 200. Thus, the semiconductor chips 200 may be inserted into the slits S of the PCB 300.

When a same kind of the semiconductor chips 200 are mounted on the PCB 300, the electrode pads 330 in each of the slits S may be arranged in a same pattern. However, when different kinds of the semiconductor chips 200 are mounted on the PCB 300, the arrangements of the electrode pads 330 by the slits S may be different from each other.

Referring to FIG. 8, the PCB 300 may include a plurality of ball pads 370 on an edge portion of the bottom surface 320. A plurality of inner wirings 360 may be formed in the PCB 300. The inner wirings 360 may be electrically connected between the ball pads 370 and the electrode pads 330. External terminals 380 such as solder balls may be attached to the ball pads 370.

Figure 9:
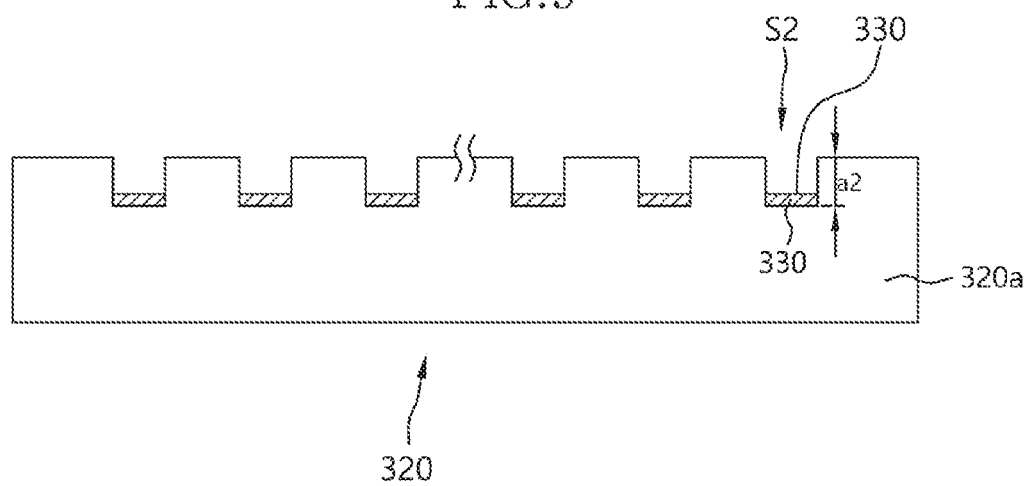
FIG. 9 is a cross-sectional view illustrating a bottom surface of a PCB in accordance with an embodiment.
Figure 10:
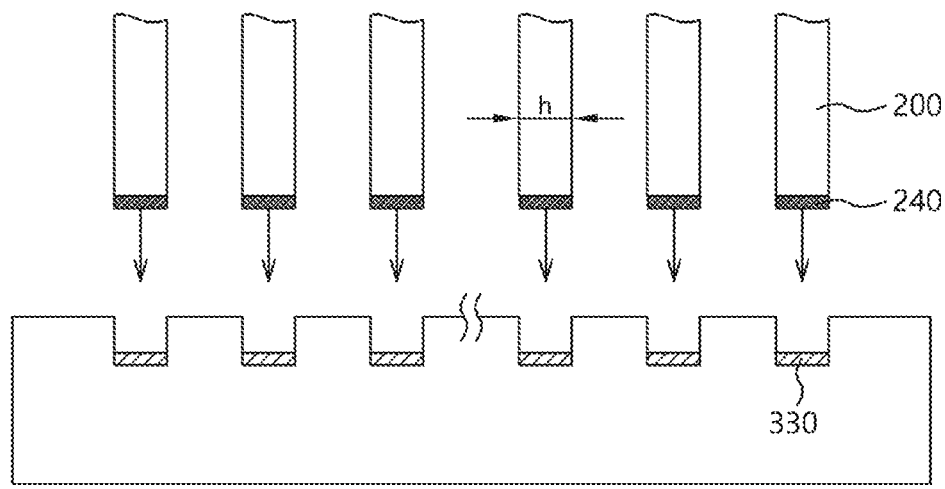
FIGS. 10 and 11 are cross-sectional views illustrating a method of mounting a semiconductor chip on a PCB in accordance with an embodiment.
Figure 11:
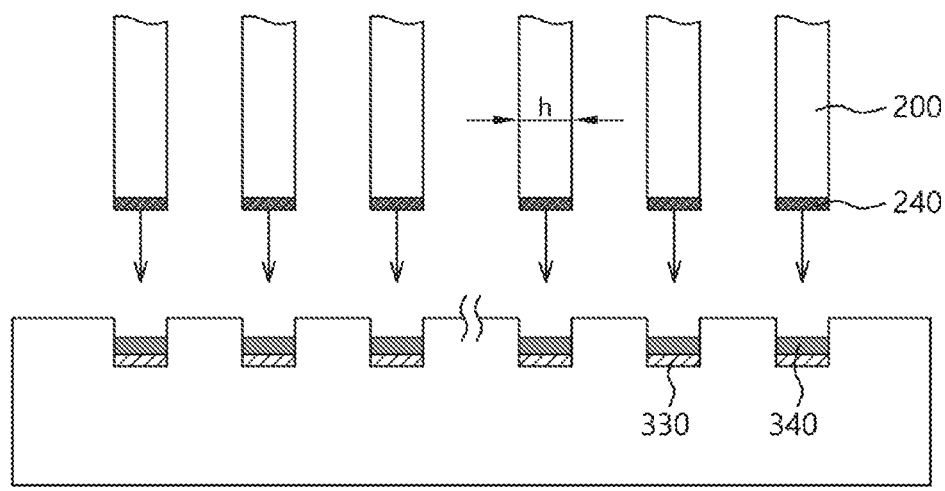
Figure 12:
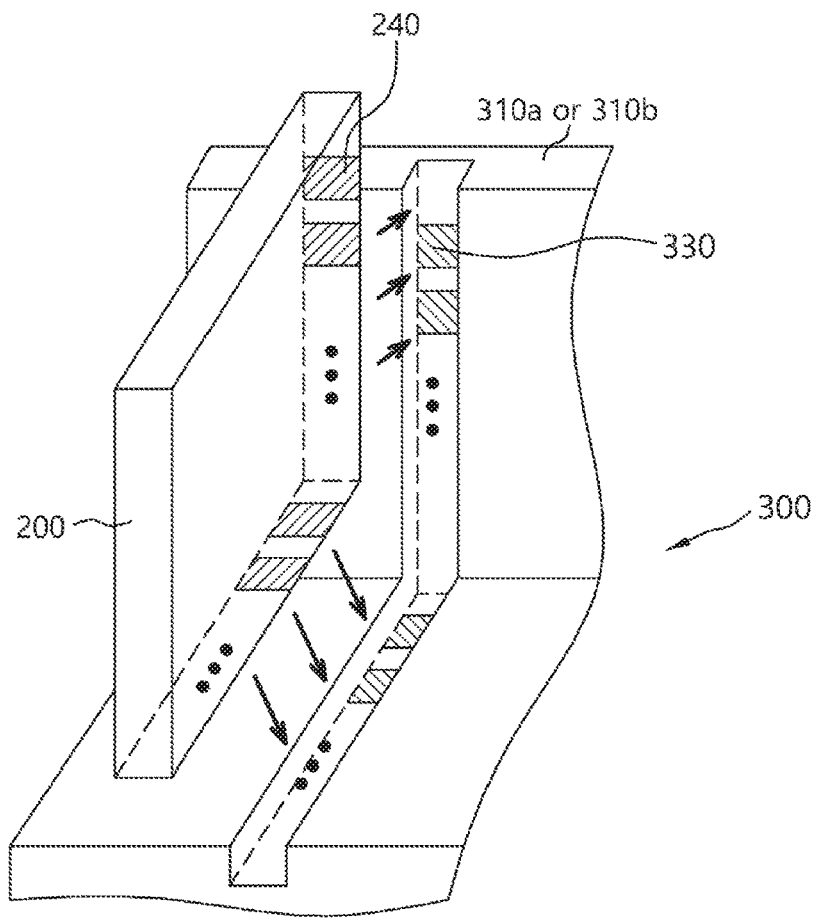
FIG. 12 an exploded perspective view illustrating a method of mounting a semiconductor chip on a PCB in accordance with an embodiment.

FIG. 9 is a cross-sectional view illustrating a bottom surface of a PCB in accordance with an embodiment. FIG. 9 is the cross-sectional view taken along a line VIII-VIII' in FIG. 6. FIGS. 10 and 11 are cross-sectional views illustrating a method of mounting a semiconductor chip on a PCB in accordance with an embodiment, and FIG. 12 is an exploded perspective view illustrating a method of mounting a semiconductor chip on a PCB in accordance with an embodiment.

Referring to FIG. 9, a circuit substrate 320a may be prepared. The circuit substrate 320a may correspond to a base for forming the bottom surface 320 or the first and second side surfaces 310a and 310b of the PCB 300. In an embodiment, the circuit substrate 320a may be used for forming the bottom surface 320. Alternatively, the circuit substrate 320a may be used for forming the first and second side surfaces 310a and 310b.

Further, although not depicted in drawings, various electrode layers may be formed in the circuit substrate 320a.

A selected region of the circuit substrate 320a may be removed by a depth a2 to form the slits S2. A conductive layer may be formed in the slits S2 to form the electrode pad 330. The electrode pad 330 may have a thickness less than the depth of the slit S2. The conductive layer may be formed by a process for forming an electrode pad on a general PCB. Although not depicted in drawings, the electrode pad 330 may be electrically connected with any one the various electrode layers in the circuit substrate 320a. Thus, the bottom surface 320 of the PCB 300 may be formed. In an embodiment, a selected region of the circuit substrate 320a may be removed by a depth a2 to form the slits S1. A conductive layer may be formed in the slits S1 to form the electrode pad 330. The electrode pad 330 may have a thickness less than the depth of the slit S1. The conductive layer may be formed by a process for forming an electrode pad on a general PCB. Although not depicted in drawings, the electrode pad 330 may be electrically connected with any one the various electrode layers in the circuit substrate 320a. Thus, the first and second side surfaces 310a or 310b of the PCB 300 may be formed.

Referring to FIG. 10, each of the semiconductor chips 200 may be inserted into the slits S2. For example, the upper surface of the semiconductor chip 200 may be rotated at an angle of about 90° with respect to the bottom surface 320. The rotated semiconductor chip 200 may then be inserted into the slit S2 to electrically connect the side bonding pad 240 of the semiconductor chip 200 with the electrode pad 330.

As mentioned above, because the width a1 of the slit S2 may be substantially equal to or greater than the height h of any one of the side surfaces 201S1-201S3 of the semiconductor chip 200, the semiconductor chip 200 may be readily inserted into the slit S2.

Referring to FIG. 11, in order to improve contact and signal characteristics between the side bonding pad 240 and the electrode pad 330, a connection terminal 340 such as a conductive bump may be additionally interposed between the side bonding pad 240 and the electrode pad 330.

Referring to FIG. 12, the semiconductor chip 200 including the side bonding pad 240 may be inserted and fixed to the slit S of the PCB 300 including the electrode pad 330 to complete the multi-chip package. The side bonding pad 240 of the semiconductor chip 200 may be electrically connected to the electrode pad 330 of the PCB 300. In an embodiment, for example, in order to improve contact and signal characteristics between the side bonding pad 240 and the electrode pad 330, a connection terminal 340 such as a conductive bump may be additionally interposed between the side bonding pad 240 and the electrode pad 330.

Figure 13:
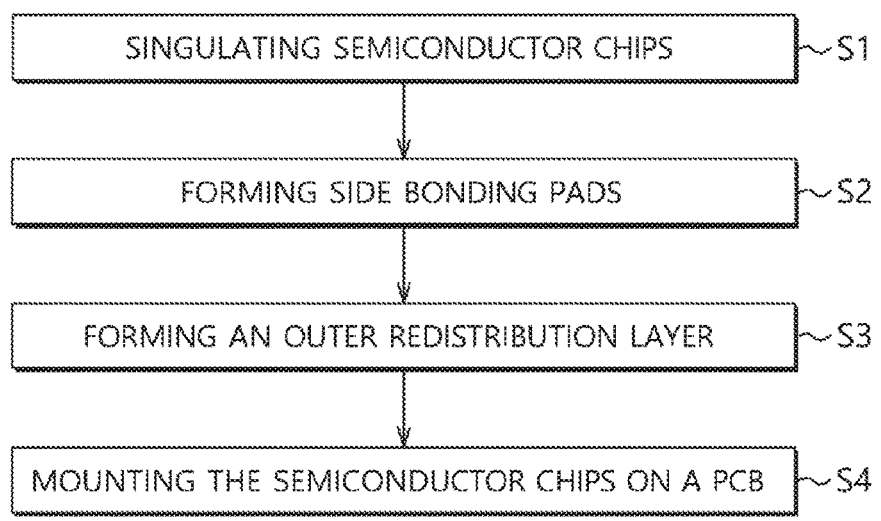
FIG. 13 is a flow chart illustrating a method of manufacturing a multi-chip package in accordance with an embodiment.

FIG. 13 is a flow chart illustrating a method of manufacturing a multi-chip package in accordance with an embodiment.

Referring to FIG. 13, in step S1, the wafer W may be sawed to singulate the semiconductor chips 200.

In an embodiment, a front end process may be performed on the wafer W. The wafer W may be divided into the semiconductor chips 200. The bonding pads 220 may be arranged outside the scribe lanes of the wafer W corresponding to the edge region of the semiconductor chip 200. A wafer level test process may be performed on the wafer W. The wafer W may be cut along the scribe lanes to singulate the semiconductor chips 200.

The front end process may include a process for forming semiconductor elements on a bare wafer, a process for forming the bonding pad 220, a process for forming the inner redistribution layer 230a, a process for forming a passivation layer, etc.

In step S2, the side bonding pad 240 may be formed at each of the semiconductor chips 200. The side bonding pad 240 corresponding to the bonding pad 220 may be formed on the side surfaces 201S1~201S3 of the semiconductor chip 200. For example, the side bonding pad 240 may be formed by depositing a metal layer and patterning the metal layer. The side surfaces s01S1~201S3 may correspond to the edge region in which the bonding pad 220 may be arranged.

In step S3, the outer redistribution layers 230b and 230c may be formed on the edge portion of the upper surface 201f and the side surfaces 201S1~201S3 of the semiconductor chip 200 to electrically connect the side bonding pad 240 with the bonding pad 220. The outer redistribution layers 203b and 230c may be formed by a general process for forming a redistribution layer.

In step S4, the semiconductor chip 200 may be mounted on the "U" shaped PCB 300 having the slits S. That is, the semiconductor chip 200 may be rotated to arrange the upper surface 201f substantially perpendicular to the bottom surface 320 of the PCB 300. The rotated semiconductor chip 200 may be inserted into the slit S. The semiconductor chip 200 having the side bonding pad 240 may be inserted into the slit S to correspond the side surfaces 201S1~201S3 of the semiconductor chip 200 to the side surfaces 310a and 310b and the bottom surface 320 of the PCB 300. Thus, the side bonding pad 240 of the semiconductor chip 200 may be electrically connected to the electrode pad 330 of the PCB 300.

A general molding process may then be performed to complete the multi-chip package 100.

According to an embodiment, the semiconductor chips may be directly mounted on the PCB without the expensive TSV and the wire having short danger. Thus, because the semiconductor chip may be directly connected to the PCB, signal transmission characteristics may be remarkably improved.

Figure 14:
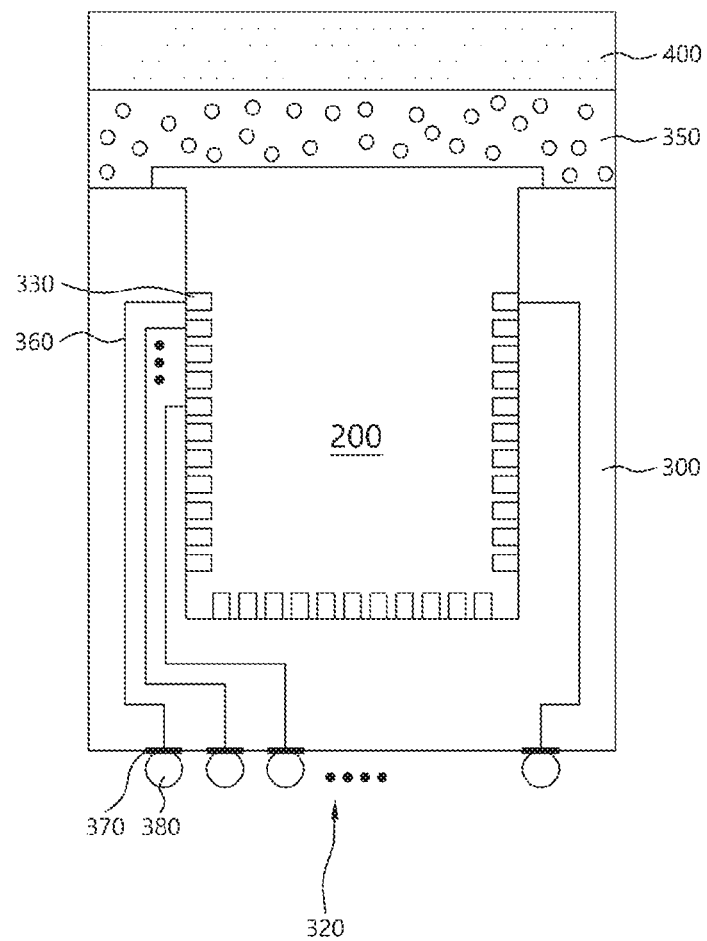
FIG. 14 is a cross-sectional view illustrating a multi-chip package in accordance with an embodiment.

FIG. 14 is a cross-sectional view illustrating a multi-chip package in accordance with an embodiment.

Referring to FIG. 14, a resin layer 350 as a molding layer may be formed on the multi-chip package 100 by a molding process. A heat dissipation plate 400 may be formed on the resin layer 350.

The heat dissipation plate 400 may function as to dissipate heat in the semiconductor chip 200. For example, the heat dissipation plate 400 may include a material having high heat conductivity. Additionally, uneven portions may be formed on the heat dissipation plate 400.

The semiconductor chips 200 may be spaced apart from the heat dissipation plate 400 by a uniform gap. Thus, the semiconductor chips 200 may have substantially the same heat dissipation efficiency. As a result, power consumption of the multi-chip package may be improved.

Figure 15:
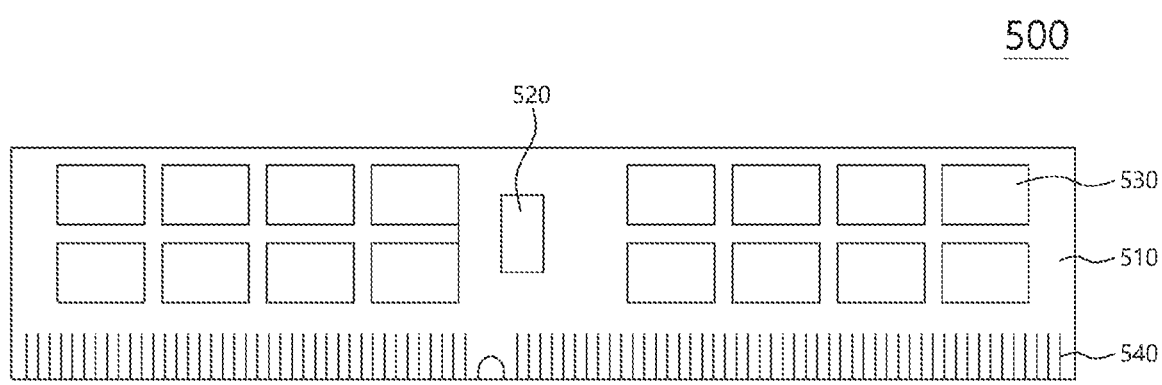
FIG. 15 is a plan view illustrating a semiconductor module in accordance with an embodiment.

FIG. 15 is a plan view illustrating a semiconductor module in accordance with an embodiment.

Referring to FIG. 15, a semiconductor module 500 may include a module substrate 510, a control chip 520 and a plurality of semiconductor packages 530. The control chip 520 may be mounted on the module substrate 510. The module substrate 510 may include a plurality of input/output terminals 540. The semiconductor package 530 may include the multi-chip package 100 of the examples of the embodiments.

The above described embodiments are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A multi-chip package comprising:
a plurality of semiconductor chips, wherein each semiconductor chip comprises a bottom surface, an upper surface, and a plurality of side surfaces, the upper surface on which circuit terminals are arranged, and a plurality of side bonding pads directly arranged on one or more selected side surface among the side surfaces, wherein a selected circuit terminal among the circuit terminals is electrically connected with a selected side bonding pad among the plurality of side bonding pads; and
a printed circuit board (PCB) to which the semiconductor chips are mounted, the PCB including a first side surface, a second side surface being parallel with the first side surface, a bottom surface being connected between one end of the first side surface and one end of the second side surface, a plurality of slits formed in the first side surface, the second side surface, and the bottom surface to receive the semiconductor chips, and a plurality of electrode pads arranged in the slits and electrically connected with the side bonding pads,
wherein each slit from among the slits in the first side surface, each slit from among the slits in the second side surface, and each slit from among the slits in the bottom surface are connected with each other without a discontinuous section,
wherein the upper surface of the semiconductor chip comprises a core region in which the circuit terminals are arranged, four edge regions configured to surround the core region and face four of the side surfaces, and bonding pads connected with the circuit terminals are arranged in an edge region among the four edge regions facing the selected side surfaces, and
wherein each semiconductor chip includes four side surfaces and the side bonding pads are arranged on three side surfaces among the four side surfaces, and
further comprising:
an outer redistribution layer electrically connected between the side bonding pads and the bonding pads, and
connection terminals interposed between the side bonding pads of the semiconductor chips and the electrode pads of the PCB.

2. The multi-chip package of claim 1, wherein at least one semiconductor chip from the plurality of semiconductor chips has a substantially hexahedral shape.

3. The multi-chip package of claim 1, wherein the plurality of side bonding pads are arranged on at least two successively arranged selected side surfaces among the selected side surfaces.

4. The multi-chip package of claim 1, wherein the PCB is configured to contact the selected side surfaces on which the side bonding pads are arranged.

5. The multi-chip package of claim 1, further comprising an inner redistribution layer electrically connected between the circuit terminals and the bonding pads.

6. The multi-chip package of claim 1, wherein the side bonding pads are arranged on a number of the side surfaces less than a total number of the side surfaces for a selected semiconductor chip from among the semiconductor chips.

7. The multi-chip package of claim 1, wherein each slit has a width substantially equal to or greater than a height of the side surfaces of each semiconductor chip.

8. The multi-chip package of claim 1, wherein the PCB further comprises:
a plurality of ball pads arranged on an edge portion of the bottom surface; and
an inner wiring arranged in the PCB to electrically connect one of the electrode pads with one of the ball pads.

9. The multi-chip package of claim 8, further comprising external terminals mounted on the ball pads.

10. The multi-chip package of claim 1, further comprising a molding member formed on the PCB to cover the semiconductor chips.

11. The multi-chip package of claim 10, further comprising a heat dissipation plate arranged on the molding member to dissipate heat generated from the semiconductor chips.

* * * * *